United States Patent [19]

Thompson et al.

[11] Patent Number: 4,510,624

[45] Date of Patent: Apr. 9, 1985

[54] NOISE BLANKING ARRANGEMENT TO MINIMIZE BLANKER SPLATTER

[75] Inventors: Sharon E. Thompson, Rolling Meadows; Bruce C. Eastmond, Downers Grove, both of Ill.

[73] Assignee: Motorola, Inc., Schaumburg, Ill.

[21] Appl. No.: 535,001

[22] Filed: Sep. 22, 1983

[51] Int. Cl.³ .............................................. H04B 1/10
[52] U.S. Cl. ................................... 455/223; 455/311
[58] Field of Search ............... 455/194, 212, 222–225, 455/303, 311, 218, 219; 375/104; 328/165

[56] References Cited

U.S. PATENT DOCUMENTS

| | | |
|---|---|---|
| 3,191,123 | 6/1965 | Eness et al. . |
| 3,304,503 | 2/1967 | Walker, Jr. et al. . |
| 3,462,691 | 8/1969 | McDonald . |
| 3,699,457 | 10/1972 | Wright . |
| 3,725,674 | 4/1973 | Schaeffer et al. . |
| 3,958,181 | 5/1976 | Hansen et al. . |
| 3,961,268 | 6/1976 | Hansen . |
| 4,053,843 | 10/1977 | Wright et al. . |
| 4,114,105 | 9/1978 | Duncan . |
| 4,203,072 | 5/1980 | Beningfield et al. ............... 455/223 |
| 4,236,254 | 11/1980 | Augustin et al. .................. 455/223 |
| 4,334,317 | 6/1982 | Beesley ............................. 455/194 |
| 4,352,030 | 9/1982 | Beesley ............................. 307/350 |
| 4,373,139 | 2/1983 | Beesley ............................. 307/350 |
| 4,466,129 | 8/1984 | Skutta ............................... 455/223 |

Primary Examiner—Jin F. Ng
Attorney, Agent, or Firm—James E. Jacobson; James W. Gillman; Edward M. Roney

[57] ABSTRACT

Method and apparatus are provided for impulse noise blanking in a radio receiver wherein blanking attenuators are provided in both the wideband, prefilter stage and narrowband, postfilter stage of the receiver so that the bandwidth and location in the receiver in which blanking is provided is optimized dependent upon signal conditions.

26 Claims, 12 Drawing Figures

IMPULSE NOISE AT THE ANTENNA

SPECTRUM OF NOISE PULSE

NOISE PULSE AT MIXER OUTPUT

WIDEBAND BLANKING PULSE

POST FILTER CARRIER PLUS NOISE

NARROWBAND BLANKING PULSE

AUDIO NOISE PULSE WITH NARROWBAND BLANKING

AUDIO BLANKING PULSE

NOISE BLANKING ARRANGEMENT TO MINIMIZE BLANKER SPLATTER

BACKGROUND OF THE INVENTION

The present invention relates generally to noise suppression in radio receivers and, more particularly, to an improved impulse noise blanking arrangement for selectively blanking in either the wideband or narrowband portion of the receiver, dependent upon specific signal conditions.

Impulse noise interference typically includes frequency spectral components which have large amplitude and which are distributed throughout a wide frequency range extending up to several hundred MHz. Thus, impulse noise is capable of interfering with the radio waves within the spectrum which is modulated with desired signal informaton. This interference degrades the receiver performance and appears as an undesirable audio output that may obliterate the desired signal output. Noise blanking circuits are used to alleviate this problem.

Impulse noise blanking circuits for use in communication radio receivers are of course known in the art. Generally, blanker circuits detect noise pulses that are received at the antenna along with transmitted information signals. The detected noise pulses are processed whereby blanking pulses are produced which are employed to blank the receiver for the duration of each blanking pulse, thus preventing the noise pulse from being heard by the listener. Typically the blanker circuits include rate shut-off and level shut-off circuitry to inhibit blanking operation for a predetermined blanking pulse repetition rate and according to noise energy level. Such representative blanking circuits are described and claimed in U.S. Pat. Nos. 3,304,503, 3,699,457, 3,725,674 and 4,334,317 and assigned to the same assignee as the present invention. The U.S. Pat. Nos. 3,699,457, 3,725,674 and 4,334,317 patents teach blanking in the wideband, prefilter stage of the receiver. The U.S. Pat. No. 3,304,503 patent teaches blanking in both the radio frequency (RF) and intermediate frequency (IF) portions of the receiver, but not selectively in either portion. The system of the present invention is an improvement over circuits of this type.

One problem that has arisen in prior systems is that if a noise blanker is used which turns off the radio frequency or wideband stage whenever a noise impulse is present in this stage, an undesirable form of interference known as modulation or blanker splatter may occur. In rapidly turning on and off the radio frequency stage of a receiver, by means of blanking pulses, sidebands are generated through modulation of the undesired signal by the blanking pulses. These sidebands may be very close in frequency to the desired signal and within the passband of the intermediate frequency stages. In such cases the undesired sidebands will not be filtered out and will appear in the receiver output as interference and thus, will degrade the receiver processed signal.

As a noise pulse passes through the frequencyselective stages of a receiver, it is amplified, and stretched in time due to the effects of the filtering. Since the receiver should be turned off during the entire time that the noise pulse is present in the stage of the receiver which is being blanked, blanking in the narrowband, postfilter stages of the receiver requires that the receiver be turned off for an appreciably longer time than if the blanking is accomplished in the wideband, prefilter stages of the receiver. Noticeable audio distortion may occur as a result of the longer blanking pulse which is required when blanking in the narrowband postfilter stages of the receiver. However, narrowband blanking can prevent the impulse noise disturbance from being reproduced by the receiver speaker and degrading the reproduced audio quality when wideband blanking would cause blanker splatter. For signal conditions where blanker splatter results from blanking in the wideband stage of the receiver, blanking in the narrowband stage of the receiver improves the reproduced audio quality while avoiding the generation of blanker splatter.

SUMMARY OF THE INVENTION

It is, therefore, an object of the present invention to provide an improved noise blanking system which effectively attenuates impulse noise without giving rise to undesirable modulation or blanker splatter.

Another object is to provide an adaptive bandwidth noise blanking system wherein blanking attenuator means are operative in either of the wideband or narrowband portion of the radio receiver according to on-channel and off-channel signal energy levels to provide improved blanking characteristics.

Briefly, the present invention provides an improved method and apparatus for impulse noise blanking in a radio receiver having a wideband, prefilter stage and a narrowband, postfilter stage. The method comprises the steps of: (a) sensing the signal level in the wideband stage and providing a corresponding first output signal; (b) sensing the signal level in the narrowband stage and providing a corresponding second output signal; (c) comparing the first and second output signals to produce a control signal; and (d) blanking impulse noise in either the wideband, prefilter stage the narrowband, postfilter stage in response to the specific control signal.

DESCRIPTION OF THE PREFERRED EMBODIMENT

Briefly, according to the invention, an improved noise blanking arrangement is provided in a radio communication receiver that is responsive to particularized signal conditions. Blanking attenuators are provided in both the wideband, prefilter stage and the narrowband, postfilter stage of the receiver so that the bandwidth and location in the receiver in which blanking is provided is dependent upon specific signal conditions.

The blanking attenuators turn off or blank the radio receiver channel in response to blanking pulses, for example, by shunting the desired signal and noise impulses to ground, thereby preventing the noise from being propagated past the blanking attenuators and being heard at the speaker. In order to avoid noticeable degradation of the desired audio signal, the blanking pulse width is minimized by preferably providing the blanking attenuators in the wideband, prefilter stage of the receiver. However, until now, with the blanking attenuators located in the wideband, prefilter stage of the receiver, and depending upon specific signal conditions, the action of the wideband blanking attenuators can give rise to undesirable blanker splatter.

Blanker splatter is the transfer of wideband, off-channel signal energy into the narrow passband of the receiver which occurs when the undesired, off-channel signal energy level is high compared to the on-channel signal energy level and the off-channel signal is modulated by the blanking pulses and sidebands of the off-channel signal are generated by the modulation. These sidebands may fall within the bandpass response of the receiver and are thus amplified in the subsequent receiver stages. It is this modulation of undesired carriers by the recurrent action of the blanking attenutors that are provided in the wideband, prefilter stage of the receiver which causes splatter to be generated, thereby degrading the performance of the receiver.

Thus, for the signal condition where the off-channel, undesired signal energy is significantly higher than on-channel, desired signal energy, the blanking attenuators in the narrowband stage of the receiver are utilized, thereby avoiding the generation of blanker splatter. In the absence of high off-channel signal energy, the blanking attenuators in the wideband, prefilter stage are utilized with the required blanking pulse width minimized to provide optimum blanking performance and thus minimize audio distortion.

Figure 1:
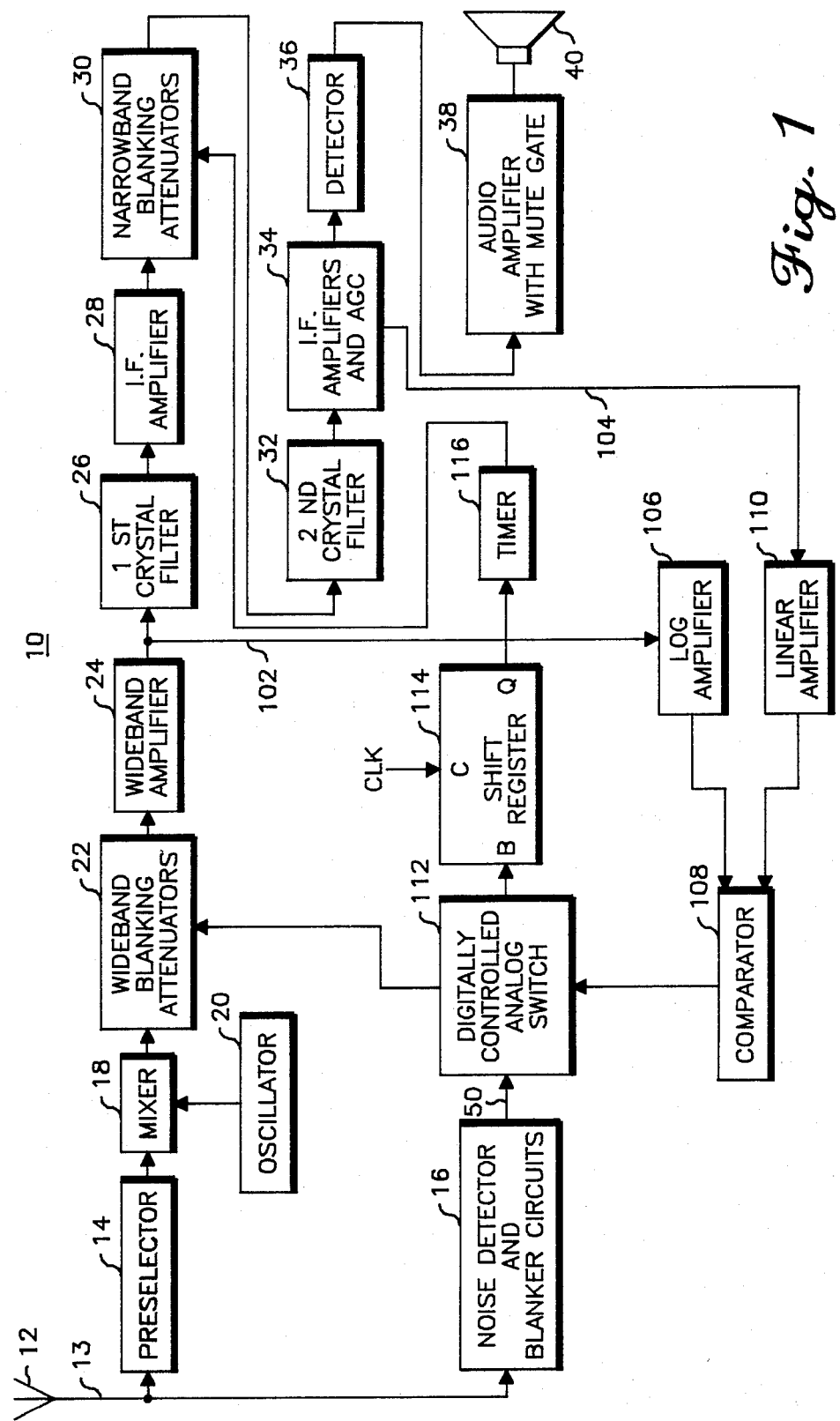
FIG. 1 is a block diagram illustrating a preferred embodiment of the invention.

Referring to FIG. 1, there is shown a block diagram of a radio receiver including an impulse noise blanking arrangement according to the invention and designated generally by the reference character 10. It is to be understood that a receiver is known in the art. Typically, a conventional radio receiver includes antenna 12, preselector 14, noise detector and blanker circuits 16, mixer 18, oscillator 20, wideband blanking attenuators 22, wideband amplifier 24, first crystal filter 26, I.F. amplifier 28, second crystal filter 32, I.F. amplifiers and AGC module 34, detector 36, audio amplifier 34, speaker 40. The foregoing are typically found in the conventional receiver and as such, form the environment in which the present invention functions.

The antenna 12 receives the transmitted radio frequency signals and any noise signals that are introduced by the transmitting medium. Signals 13 from the antenna 12 are applied both to an RF preselector 14 and a noise detector and blanker circuits 16. Preselector 14 is tuned to a desired frequency and has at least the necessary bandwidth for receiving the desired signal. A plurality of low loss, highly selective helical resonant cavities may be employed to form the RF preselector 14. The RF signals received by antenna 12 including the desired information signals and undesired adjacent channel signals are routed through the preselector cavities to a mixer stage 18 to be heterodyned with an injection frequency signal provided by an oscillator 20. Mixer 18 converts the received radio frequency signal from preselector 14 to an intermediate frequency. Wideband blanking attenuators 22 couple the intermediate frequency output of mixer 18 to a wideband amplifier 24. The amplified signals are applied to a first crystal filter 26.

First crystal filter 26 is a narrow bandpass filter which provides most of the selectivity characteristic of the receiver, and which selects the desired IF signal. The narrowband filtered output of filter 26 is coupled to an IF amplifier 28. Narrowband blanking attenuators 30 are connected to the output of IF amplifier 28 to provide for blanking in the postfilter, narrowband stage of the receiver.

The output of the narrowband blanking attenuators 30 is applied to a second crystal filter 32 which establishes the final receiver selectivity. The output of the second crystal filter 32 is coupled to IF amplifiers and automatic gain control (AGC) circuit 34. Detector 36, which is connected to the output of IF amplifier and AGC 34, demodulates the audio signal from the IF signal. Audio amplifier with mute gate module 38 is coupled to the output of detector 36 and amplifies and applies the demodulated signal to a speaker 40.

Noise detector and blanker circuits 16 detects impulse noise in the radio signals received at antenna 12 and generates blanking pulses to be selectively applied to the wideband blanking attenuators 22 or conditioned and applied to narrowband blanking attenuators 30 dependent upon the signal conditions. Noise detector and blanker circuits 16, for example, may be tuned to a frequency selected away from the center frequency of preselector 14 so that there is not a division of the desired signal therebetween.

Noise detector and blanker circuits 16 is known in the art and any of various known circuits can be employed for circuit 16, such as the "Extender" ® channel supplied by Motorola Inc. with MICOR ® radio receivers and further described in *Supplement to Instruction Manual,* 68P81008E40.

Figure 2:
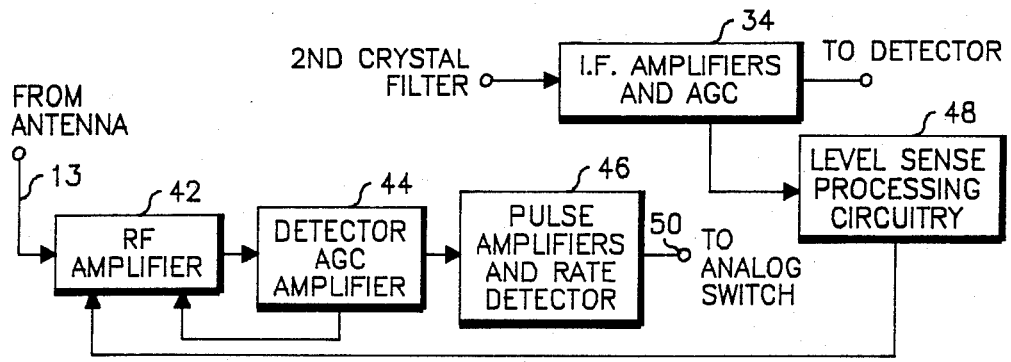
FIG. 2 is a block diagram illustrating a typical noise detector and blanker circuits as included in FIG. 1.

Referring to FIG. 2, there is shown a block diagram of such a typical noise detector blanker circuit 16 including RF amplifiers 42, Detector and AGC amplifiers 44, pulse amplifier and rate detector 46 and level sense processing circuitry 48. Signals 13 are applied to the RF amplifiers 42 which may be a multistage amplifier that is capable of providing 60 dB of gain or voltage amplification to incoming impulse noise. The amplified noise signals are coupled to detector and AGC amplifiers 44. The AGC amplifier provides feedback to RF amplifiers 42 to vary the amplification characteristics according to the level of input signal 13.

The amplified noise signals are demodulated or converted into pulses with the rf components removed by detector 44. The pulses are applied to pulse amplifier and rate detector 46 that provides an output 50 of blanking pulses that is utilized to activate blanking attenuators, whereby all signals are interrupted through the receiver channel for the duration of each blanking pulse. Thereby, the impulse noise disturbance is prevented from being reproduced by the receiver speaker 40 and degrading the reproduced audio quality.

The rate detector 46 shuts off the blanking pulses when the blanking pulse repetition rate is above a predetermined rate, for example, 70 KHz and for a predetermined period of time, for example, 1½ milliseconds.

The level sense processing circuitry 48 is coupled to the AGC output of IF amplifiers and AGC circuit 34 to sense the carrier energy level and an output of level sense processing circuitry 48 is coupled to RF amplifiers 42 in order to vary the amplification characteristics thereof according to the carrier energy level. The level sense processing circuitry 48 forms a shut off which prevents generation of blanking pulses whenever the noise pulses are of low amplitude as related to the carrier since the receiver degradation due to the noise decreases as the desired carrier level increases. Thus, the output 50 of noise detector and blanker circuits 16 comprises blanking pulses corresponding to both predetermined level and rate of the impulse noise.

Figure 3:
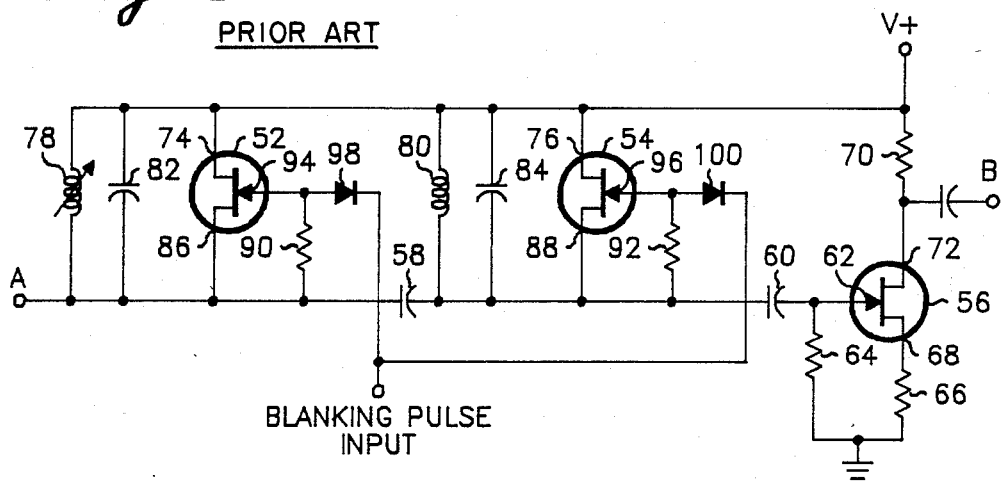
FIG. 3 is a schematic diagram illustrating a blanking attenuator circuit.

Referring now to FIG. 3, there is shown a schematic diagram illustrating a blanking attenuator circuit which can be effectively employed for both wideband blanking attenuators 22 and narrowband blanking attenuators 30. The blanking attenuator circuit includes two attenuator stages provided by field effect transistor FET attenuators 52, 54 and a buffer or impedance matching stage provided by FET buffer 56. The desired signals and any undesired signals are applied to the input A of the blanking attenuator circuit. Normally, these signals are applied through coupling capacitors 58 and 60 to the gate 62 of FET buffer 56. Resistor 64 coupled between gate 62 and ground potential acts to provide a biasing potential at gate 62. Resistor 66 coupled between the source 68 and ground potential provides the bias potential at source 68 of FET 56. A DC supply potential V+ is coupled through bias resistor 70 to the drain 72 of FET 56 to provide the bias potential thereat. The output of buffer FET 56 is coupled from drain 72 through a DC blocking capacitor to the output B of the blanking attenuator circuit to be applied to subsequent stages in the receiver.

In operation, FET attenuators 52, 54 are biased to be normally nonconductive. The blanking pulse is utilized to activate FET attenuators 52, 54 that bypass all signals passing through the signal channel to signal ground for the duration of the blanking pulse. The DC supply potential V+ is coupled to the drain 74, 76 of FET attenuators 52, 54. A parallel resonant circuit formed of variable inductor 78, 80 and capacitor 82, 84 respectively, connected in parallel is coupled from drain 74, 76 to source 86, 88 of FET attenuators 52, 54. A biasing resistor 90, 92 is coupled between the gate 94, 96 and the source 86, 88, respectively. The blanking pulses are coupled through diodes 98, 100 to gates 94, 96 to simultaneously active FET attenuators 52, 54. The FET attenuators conduct for the duration of the blanking pulse and bypass all signals to signal ground, thereby interrupting the output B of the blanking attenuator circuit.

Referring again to FIG. 1, energy levels are detected in the wideband, pre-filter stage and narrowband, post-filter stage, in order to determine the location and bandwidth in the receiver where blanking is most effective.

A wideband output signal 102 corresponds to all signal energy including the off-channel energy level. A post filter signal output 104 from the IF amplifiers in AGC module 34 corresponds to the on-channel signal energy level.

According to the invention, when the off-channel energy rises significantly above on-channel energy, the narrowband blanking attenuators 30 are employed; otherwise, wideband blanking attenuators 22 are utilized. For example, if the wideband energy level is 20 db higher than the narrowband level, the narrowband blanking attenuators 30 are employed.

The amplitude of wideband signal 102 is converted to a logarithmic representation thereof by a log amplifier 106 and the converted signal is applied to a comparator 108. The AGC output signal 104 which already has an inherent logarithmic relationship to the signal level is applied to a linear amplifier 110 that is provided with a predetermined offset. The narrowband AGC signal 104 is amplified and level shifted corresponding to the predetermined offset by linear amplifier 110 and is applied to comparator 108.

Comparator 108 compares the two input signals and provides a control output signal responsive thereto. The control output signal of comparator 108 is applied to the control input of a digitally-controlled analog switch 112.

The noise blanking pulses generated by noise detector and blanker circuits 16 are coupled to switch input of the digitally controlled analog switch 112. Analog switch 112 operates to couple the blanking pulses either to the wideband blanking attenuators 22 or to shift register 114 according to the output of comparator 108. Analog switch 112 can be a CMOS integrated circuit such as Motorola-type MC14053D.

When the wideband energy level is higher than the narrowband energy level by the predetermined amount, established by the offset provided with linear amplifier 110, the blanking pulses generated by noise detector and blanker circuits 16 are coupled by the analog switch 112 to the shift register 114. Shift register 114 is utilized to provide a time delay so that the blanking pulse input to the narrowband blanking attenuators 30 coincide with the impulse noise at that narrowband stage of the receiver. Shift register 114 can be a CMOS integrated circuit such as Motorola type MC14557B. The blanking pulses from shift register 114 are coupled through a retriggerable timer 116 to the narrowband blanking attenutors 30. The retriggerable timer 116 provides the additional pulse width required for blanking in the narrowband stage of the receiver. For example, an 8 microsecond blanking pulse may be employed for wideband blanking attenuators 22 and a 400 microseconds pulse width may be required in the narrowband stage of the receiver to effectively blank the impulse noise. The retriggerable timer 116 can be a CMOS integrated circuit, Motorola-type MC14528B.

In operation, the digitally-controlled analog switch 112 normally couples the output 50 of blanking pulses from noise detector and blanker circuits 16 to the wideband blanking attenuators 22. For signal condition where the action of the wideband blanking attenuators 22 is likely to cause splatter, the narrowband blanking attenuators 30 are employed. Such signal conditions are determined from the detected wideband output signal 102 and narrowband AGC signal 104.

Figure 4:
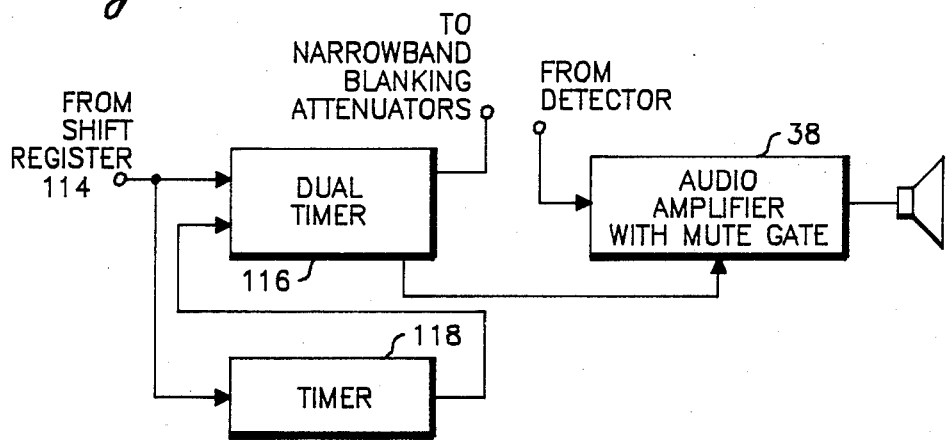
FIG. 4 is a block diagram illustrating a modification of the FIG. 1 embodiment.

Referring now to FIG. 4, there is shown a block diagram illustrating a modification of the FIG. 1 embodiment wherein blanking in the audio stage 38 is additionally provided. In some instances, distortion can result in the audio output of speaker 40 as a result of the operation of the narrowband blanking attenuators 30. The narrowband blanking pulse width is minimized to avoid this type of audio distortion; however, the narrowband blanking attenuators 30 modulate the desired signal in the IF stage thereby resulting in a transient that appears as additional distortion in the audio output of the speaker 40. Therefore, blanking in the audio stage 38 may be provided to further improve the audio signal when narrowband blanking is employed. This is further described below in reference to FIG. 5.

An additional timer 118 is coupled between shift register 114 and dual retriggerable timer 116 to provide a time delay for the blanking pulses that are coupled to audio amplifier with mute gate 38. The noise blanking in the audio amplifier with mute gate 38 is provided to blank the receiver during the transient caused by the falling edge of the narrowband blanking pulse. The time delayed output of dual retriggerable timer 116 is coupled to the audio amplifier with mute gate 38 to blank the receiver 40 during the delayed audio blanking pulses.

Figure 5A:
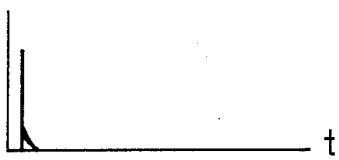
FIGS. 5A to 5H are timing diagrams illustrating the operation of the invention according to the embodiments shown in FIGS. 1 and 4.
Figure 5B:
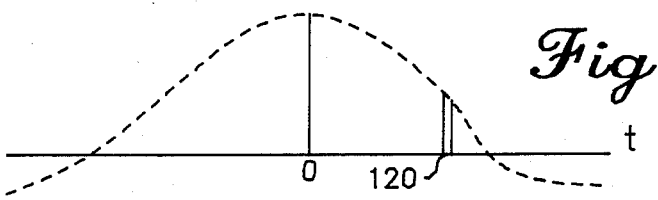

Referring now to FIGS. 5A to 5H, there are shown timing diagrams illustrating the operation of the invention according to the embodiments shown in FIGS. 1 and 4. FIG. 5A represents impulse noise that is received at the antenna 12. The impulse noise may have a pulse width in the range of 5 nanoseconds. FIG. 5B represents the frequency spectrum of the noise pulse shown in FIG. 5A with a frequency band for VHF land mobile radios designated generally by the reference character 120. The VHF land mobile radio band typically is in the range of 150 to 174 Mhz and the significant spectral content of the noise pulse extends to about 200 Mhz, thus, creating a potential source of interference.

Figure 5C:
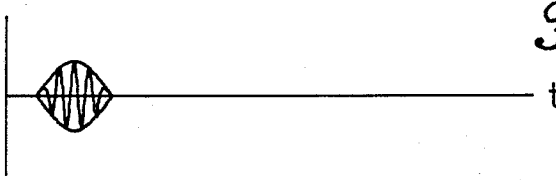
Figure 5D:
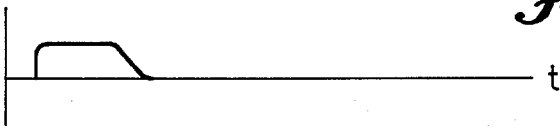

FIG. 5C illustrates the impulse noise at the output of mixer 18. The impulse noise at the mixer output stage of the receiver typically may have a pulse width of 5.5 microseconds. FIG. 5D illustrates a wideband blanking pulse having a pulse width greater than the width of the noise pulse shown in FIG. 5C. For example, the wideband blanking pulse can have a pulse width of about 8 microseconds for blanking the noise pulse of 5.5 microseconds width shown in FIG. 5C. The wideband blanking pulse is used to activate the wideband blanking attenuators 22 shown in FIG. 1. For signal conditions where the off-channel energy is not significantly above on-channel energy, the wideband blanking attenuators 22 are advantageously employed.

Figure 5E:
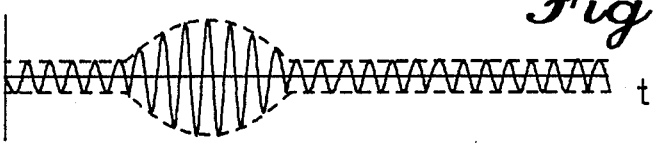
Figure 5F:
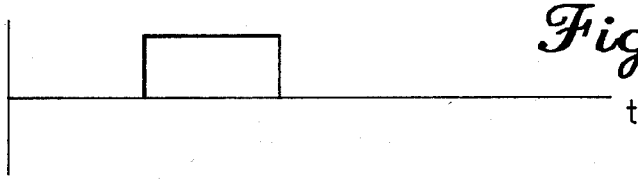

FIG. 5E illustrates a postfilter carrier signal including impulse noise that is amplified, and stretched in time due to the effects of the filtering. The envelope of the impulse noise pulse can have a width, for example, of 470 microseconds. The narrowband blanking pulse, shown in FIG. 5F, is utilized to activate the narrowband blanking attenuators 30. The narrowband blanking pulse width can be, for example, 400 microseconds. The narrowband blanking pulse width is minimized in order to minimize overall audio distortion such that some impulse noise energy is allowed to pass to subsequent stages of the receiver.

Figure 5G:
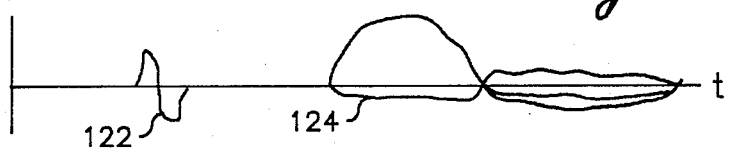

FIG. 5G illustrates the noise transients that result in the audio stage of the receiver from the operation of the narrowband blanking attenuators 30. The leading edge of the blanking pulse shown in FIG. 5F causes a low level noise transient designated generally by the reference character 122 to occur in the audio stage 38 of the receiver. A larger transient designated generally by the reference character 124 results from the shutoff of the blanking pulse and the enabling of the postfilter output signal. The embodiment of the invention shown in FIG. 4 is provided to minimize the distortion caused by transient 124 resulting from the narrowband blanking operation.

Figure 5H:
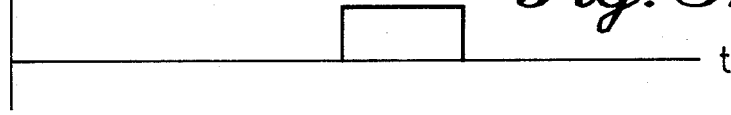

FIG. 5H illustrates an audio blanking pulse that is utilized to blank the audio amplifier with mute gate stage 38 of the receiver. The audio blanking pulse is delayed in time relative the narrowband blanking pulse to coincide with the primary lobe of noise transient 124. The width of the audio blanking pulse is minimized to avoid noticeable chopping of the audio output of the receiver. The audio blanking pulse is provided of sufficient duration to blank the primary lobe of noise transient 124, for example, 620 microseconds.

In summary, an improved noise blanking system has been described which minimizes modulation splatter and effectively attenuates impulse noise. The improved noise blanking system can be advantageously utilized in various radio communication receivers, including very high frequency single sideband (VHF SSB) receivers.

While a preferred embodiment of the invention has been described in detail, it should be understood that many modifications and variations are possible that may fall within the true spirit and scope of the invention that is defined in the appended claims.

What is claimed is:

1. An impulse noise blanking control arrangement for use in a radio receiver having a wideband, prefilter stage, a narrowband, postfilter stage and a filter coupled in between said wideband and narrowband stages, said control arrangement comprising:
   a. means for sensing the signal level in the wideband stage and providing a corresponding first output signal;
   b. means for sensing the signal level in the narrowband stage and providing a corresponding second output signal;
   c. means for comparing said first and said second output signals and producing a control signal; and
   d. means for selectively blanking impulse noise in either the wideband, prefilter stage or narrowband postfilter stage in response to said control signal.

2. The impulse noise blanking control arrangement as claimed in claim 1 wherein said means for comparing said first and said second output signals and producing a control signal includes amplifier means.

3. The impulse noise blanking control arrangement as claimed in claim 2 wherein said amplifier means include logarithmic amplifier means, and linear amplifier means having a predetermined offset.

4. The impulse noise blanking control arrangement as claimed in claim 1 wherein said control signal corresponds to a predetermined signal level ratio between on-channel signal level and off-channel signal level.

5. The impulse noise blanking control arrangement as claimed in claim 1 wherein said means for selectively blanking impulse noise in either the wideband, prefilter stage or narrowband postfilter stage in response to said control signal includes
   means for detecting noise pulses in radio frequency signals received by said radio receiver and producing blanking pulses in response thereto;
   separate blanking attenuator means provided in each of the wideband, prefilter stage and the narrowband, postfilter stage of the receiver and responsive to said blanking pulses to effect noise blanking action; and p1 means for selectively enabling one of said blanking attenuator means in response to said control signal.

6. The impulse noise blanking control arrangement as claimed in claim 5 wherein said means for selectively enabling one of said blanking attenuator means includes
   switch means and
   timing means.

7. The impulse noise blanking arrangement as claimed in claim 6 wherein said switch means include digitally-controlled analog switch means.

8. The impulse noise blanking arrangement as claimed in claim 6 wherein said timing means include time delay means and blanking pulse width extender means for blanking in the narrowband, postfilter stage of the receiver.

9. The impulse noise blanking arrangement as claimed in claim 8 wherein said time delay means include shift register means.

10. The impulse noise blanking arrangement as claimed in claim 8 wherein said blanking pulse width extender means include retriggerable timer means.

11. The impulse noise blanking arrangement as claimed in claim 1 wherein said means for blanking in narrowband, postfilter stage include at least means for blanking in an intermediate frequency portion of the receiver.

12. The impulse noise blanking arrangement as claimed in claim 1 wherein said means for blanking in the narrowband, postfilter stage includes means for blanking in both an intermediate frequency portion and an audio portion of the receiver.

13. An impulse noise blanking system for use in a radio receiver having a signal path for conducting and translating a desired signal which receiver includes a wideband, prefilter stage, a narrowband, postfilter stage and a filter coupled in between said wideband and narrowband stages, said system comprising:
   a. means for detecting noise pulses in radio frequency signals received by said radio receiver and producing blanking pulses in response thereto;
   b. separate blanking attenuator means in each of the wideband, prefilter stage and in the narrowband, postfilter stage of the radio receiver and responsive to said blanking pulses to effect noise blanking action;
   c. means for sensing the signal level in the narrowband stage and for providing a corresponding first output signal;
   d. means for sensing the signal level in the wideband stage and for providing a corresponding second output signal;
   e. means for comparing said first and said second output signals and for producing a control signal; and
   f. means for selectively enabling either the wideband blanking attenuator means or the said narrowband blanking attenuator means in response to said control signal.

14. The impulse noise blanking control arrangement as claimed in claim 13 wherein said means for comparing said first and said second output signals and producing a control signal includes amplifier means.

15. The impulse noise blanking control arrangement as claimed in claim 14 wherein said amplifier means include logarithmic amplifier means, and linear amplifier means having a predetermined offset.

16. The impulse noise blanking control arrangement as claimed in claim 13 wherein said control signal corresponds to a predetermined signal level ratio between on-channel signal level and off-channel signal level.

17. The impulse noise blanking control arrangement as claimed in claim 13 wherein said means for selectively enabling one of said blanking attenuator means includes
   switch means and
   timing means.

18. The impulse noise blanking arrangement as claimed in claim 17 wherein said switch means include digitally-controlled analog switch means.

19. The impulse noise blanking arrangement as claimed in claim 17 wherein said timing means include time delay means and blanking pulse width extender means for blanking in the narrowband, postfilter stage of the receiver.

20. The impulse noise blanking arrangement as claimed in claim 19 wherein said time delay means include shift register means.

21. The impulse noise blanking arrangement as claimed in claim 19 wherein said blanking pulse width extender means include retriggerable timer means.

22. The impulse noise blanking arrangement as claimed in claim 13 wherein said blanking attenuator means in the narrowband, postfilter stage include at least blanking attenuator means in an intermediate frequency portion of the receiver.

23. The impulse noise blanking arrangement as claimed in claim 13 wherein said blanking attenuator means in the narrowband, postfilter stage includes blanking attenuator means in both an intermediate frequency portion and an audio portion of the receiver.

24. Method of impulse noise blanking in a radio receiver having a wideband, prefilter stage, a narrowband, postfilter stage and a filter coupled in between said wideband and narrowband stages, said method comprising:
   a. sensing the signal level in the wideband stage and providing a corresponding first output signal;
   b. sensing the signal level in the narrowband stage and providing a corresponding second output signal;
   c. comparing said first and said second output signals to produce a control signal; and
   d. blanking impulse noise in either the wideband, prefilter stage or the narrowband postfilter stage in response to said control signal.

25. Method of impulse noise blanking as claimed in claim 24 wherein blanking impulse noise in the narrowband, postfilter stage includes at least blanking impulse noise in an intermediate frequency portion of the receiver.

26. Method of impulse noise blanking as claimed in claim 24 wherein blanking impulse noise in the narrowband, postfilter stage includes blanking impulse noise in both an intermediate frequency portion and an audio portion of the receiver.

* * * * *